(12) United States Patent
Chen et al.

(10) Patent No.: US 11,906,342 B2
(45) Date of Patent: Feb. 20, 2024

(54) WALL-CLIMBING ROBOT FOR MEASURING CAPACITY OF VERTICAL METAL TANKS

(71) Applicant: Zhoushan Institute Of Calibration And Testing For Quality And Technology Supervision, Zhejiang (CN)

(72) Inventors: Xianlei Chen, Zhejiang (CN); Cunjun Li, Zhejiang (CN); Huadong Hao, Zhejiang (CN); Haolei Shi, Zhejiang (CN); Haocai Huang, Zhejiang (CN); Yiping Wu, Zhejiang (CN)

(73) Assignee: Zhoushan Institute Of Calibration And Testing For Quality And Technology Supervision, Zhoushan (CN)

( * ) Notice: Subject to any disclaimer, the term of this patent is extended or adjusted under 35 U.S.C. 154(b) by 938 days.

(21) Appl. No.: 16/876,831

(22) Filed: May 18, 2020

(65) Prior Publication Data
US 2021/0048327 A1  Feb. 18, 2021

(30) Foreign Application Priority Data

Aug. 13, 2019  (CN) .......................... 201910745612.6

(51) Int. Cl.
*G01F 17/00*  (2006.01)
*G01B 3/02*   (2020.01)
(Continued)

(52) U.S. Cl.
CPC .............. *G01F 17/00* (2013.01); *B08B 9/087* (2013.01); *B25J 11/005* (2013.01); *B25J 11/0085* (2013.01); *G01B 3/02* (2013.01); *G01R 33/02* (2013.01); *G01S 15/08* (2013.01); *G01S 17/08* (2013.01)

(58) Field of Classification Search
CPC ..... B08B 9/087; B25J 11/0085; B25J 11/005; G01F 17/00
See application file for complete search history.

(56) References Cited

U.S. PATENT DOCUMENTS

| 9,476,743 B1 | 10/2016 | Westmoreland et al. |
| 2014/0230711 A1* | 8/2014 | Lovelace ................ B08B 17/00 180/9.1 |

FOREIGN PATENT DOCUMENTS

| CN | 206177250 U | 5/2017 | |
| CN | 107036540 A * | 8/2017 | .............. B25J 19/00 |

(Continued)

*Primary Examiner* — Corbett B Coburn

(57) ABSTRACT

A wall-climbing robot for measuring capacity of vertical metal tanks includes a robot body including a chassis, a casing, and wheels. The robot body further includes: an attraction unit including a plurality of magnets; a measurement unit including a bendable ruler provided on the chassis and protruding from a top of the casing; the rust removal unit including a rust removing bucket provided at a front side of the robot body, and a driver for the lifting and lowering of the rust removing bucket; and a control unit including a microcontroller, a posture detector, an obstacle detector, an attraction detector, and a distance sensor. The wall-climbing robot of the present invention leaves no indentation on a surface of the metal tank, and is not affected by the rusts formed on the surface.

10 Claims, 7 Drawing Sheets

(51) Int. Cl.
*G01R 33/02* (2006.01)
*G01S 15/08* (2006.01)
*G01S 17/08* (2006.01)
*B08B 9/087* (2006.01)
*B25J 11/00* (2006.01)

(56) References Cited

FOREIGN PATENT DOCUMENTS

| | | | | | |
|---|---|---|---|---|---|
| CN | 206899250 | U | * | 1/2018 | |
| CN | 107782420 | A | | 3/2018 | |
| CN | 109466723 | A | * | 3/2019 | ........... B62D 57/024 |
| CN | 109720431 | A | * | 5/2019 | |
| CN | 209533415 | U | * | 10/2019 | |
| WO | WO-2018036597 | A1 | * | 3/2018 | ............. B08B 1/002 |

* cited by examiner

WALL-CLIMBING ROBOT FOR MEASURING CAPACITY OF VERTICAL METAL TANKS

CROSS-REFERENCE TO RELATED APPLICATIONS

This application claims the benefit of priority from Chinese Patent Application No. 201910745612.6, filed on Aug. 13, 2019. The content of the aforementioned application, including any intervening amendments thereto, is incorporated herein by reference in its entirety.

TECHNICAL FIELD

The present application relates to the capacity measurement for large metal tanks, more particularly to a wall-climbing robot for measuring capacity of a vertical metal tank.

BACKGROUND OF THE INVENTION

Vertical metal tanks are one of main measuring instruments for trade settlement of petrochemical products worldwide, so it is of great significance to accurately measure their capacity. Large metal oil tanks are usually formed by welding a plurality of metal plates, so inner walls thereof have different degrees of unevenness, which has a great impact on the actual capacity of the metal tanks. According to Chinese national metrological verification standard JJG168-2018 "Vertical Metal Tank Capacity", the capacity of the metal tanks shall be checked several times, including a first verification, a subsequent verification and in-service verification.

Ring plate diameter measurement is an important verification item as well as a main data source for calculating the capacity of the metal tanks. According to the Chinese national metrological verification standard JJG168-2018 "Vertical Metal Tank Capacity", the optical-reference-line method is one of the main methods for measuring the diameter of the ring plate. The method is described as follows. Conventionally, the number of horizontal and vertical measurement site is determined according to the size and deformation of the metal tank; the pulley is mounted on the top of the metal tank at the horizontal measurement sites, and the optical level is mounted on the bottom of the horizontal measurement sites; the rope passes through the pulley, and one end of the rope is fixed with the magnetic pulley carrying the ruler; and the other end of the rope is pulled by operators at the bottom of the metal tank to carry out the measurement. During the measurement process, the magnetic block is pulled by the operator to move from bottom to top, and stops at each of the vertical measuring sites (usually set at ¼ and ¾ positions of each ring plate of the metal tank), and the optical level at the bottom of the metal tank and the ruler on the magnetic block are used to measure radial deviations of the vertical measurement sites. Based on above steps, the radial deviations of all the vertical measurement sites on each of the horizontal measurement sites are measured one by one.

The method has two main difficulties: on the one hand, large vertical metal tanks are large in volume, so that excessive measuring points are required to be measured; manual operation is time-consuming and laborious, and there is a risk in aloft work; on the other hand, it is difficult for human to control the magnetic block to remain stationary, which will also cause a reduction in measurement accuracy.

Instead of manual lifting, one of ideas to improve the optical-reference-line method is to lift the magnetic block using a wall-climbing robot. Some wall-climbing robots have been invented and used in detection and measurement of the vertical metal tanks, for example, a wall-climbing robot for measuring radial deviations of the metal tanks disclosed in the Chinese Patent No. 206177250 U and Chinese Patent Application No. 201710323459.9. However, there are some inherent problems in the invention, for example, attraction situations can not be obtained in real time, so that a metal track of the wall-climbing robot will leave indentations on a surface of the metal tank; a ruler of the wall-climbing robot is too high to pass through some fire protection pipelines; and the wall-climbing robot is affected by rusts on the surface of the metal tank.

SUMMARY OF THE INVENTION

An object of the present invention is to provide a wall-climbing robot for measuring a capacity of a vertical metal tank, to overcome shortcomings of the optical-reference-line method, such as the high labor intensity, high risk and insufficient measurement accuracy. In addition, in the invention, an attraction force can be adjusted accurately to avoid leaving indentation on a surface of the metal tank; a bendable ruler is provided to pass through some fire protection pipelines; and it avoids the problem that the wall-climbing robot is affected by rusts on the surface of the metal tank.

To achieve the above objects, the present invention provides a wall-climbing robot for measuring a capacity of a vertical metal tank, comprising:

a robot body comprising a chassis and a casing, wherein a plurality of wheels are provided on both sides of the chassis; the robot body further comprises:

an attraction unit, comprising a plurality of magnets for attracting a wall of the metal tank, wherein the magnets are connected to form a mesh structure through a plurality of connectors and move under the chassis;

a measurement unit, comprising a bendable ruler provided on the chassis and protruding from a top of the casing;

a rust removal unit, comprising a rust removal bucket provided at a front side of the robot body and a driver for the lifting and lowering of the rust removal bucket; and a control unit, comprising a microcontroller, a posture detector, an obstacle detector, an attraction detector for detecting an attraction force of the magnets, a distance sensor for measuring a distance from the chassis to the wall of the metal tank, and a communication device.

In the above technical solution, when placed on the wall of the metal tank, the wall-climbing robot attracts the wall by magnetism of the magnets, and the robot body is driven to move on the wall of the metal tank through the wheels. A distance from the wall of the metal tank to a bottom of the bendable ruler is measured by the distance sensor, and the measurement result is obtained through readings of the bendable ruler, so as to measure the capacity of the metal tank. In addition, after long-term use of the vertical metal tanks, there are many problems, for example, coatings on the wall of some ring plates of the vertical metal tanks are corroded or even peeled, and exposed steel plates are rusted, which will adversely affect the accuracy and efficiency of measurement. Therefore, the rust removal bucket of the rust removal unit is provided to remove the rusts to improve the measurement accuracy.

In addition, the control unit has the following functions: when the attraction detector detects that the attraction force generated by the attraction unit does not meet a set value of the attraction force, the attraction force is controlled to approach the set value; when the posture detector detects that postures of the wall-climbing robot deviates from a set value of the posture, the wheels are controlled to return to the set posture; when the obstacle detector detects an obstacle ahead, the wheels are controlled to stop the wall-climbing robot from travelling or changing directions, and the control unit prompts an operator via the communication device.

In some embodiments, each of the connectors comprises a vertical connecting rod connected to the chassis and a pull rod or rope for connecting the magnets, wherein the pull rod is rotatable around a bottom end of the vertical connecting rod; the attraction unit adopts a gap attraction method, that is, the magnets do not directly contact the wall of the metal tank, and a gap is remained therebetween. The gap attraction method avoids the problems existing in an ordinary track-type contact attraction device. For example, the conventional track-type contact attraction device is incapable of making a turn and may wear down the wall; the track may leave indentations on the surface; some magnets on the track apply no attraction force on the wall of the metal tank causing an unnecessary load; and the motor needs to generate additional force to prevent the magnets falling off the wall of the metal tank during traveling.

Optionally, the chassis is provided with a through hole for transmission of the vertical connecting rod; an adjustment block for adjusting the vertical connecting rod to slide up and down along the through hole is provided on the through hole; the attraction detector is provided between the adjustment block and the chassis. When the attraction unit is respectively applied to wall surfaces with different curvatures, the adjustment block is adjusted by the control unit, that is, the vertical connecting rod is controlled to move up and down, so that the relative positions of the magnets are different in difference situations.

In some embodiments, the adjustment block is in threaded connection with the vertical connecting rod for easy adjustment and control.

In some embodiments, in order to control the postures of the wall-climbing robot, the chassis is provided with a motor for driving the wheels, wherein each of the wheels is connected to an output end of the motor through an elastic coupling.

In some embodiments, an end of the distance sensor is provided with a spring to allow the other end of the distance sensor to abut on the wall of the metal tank. Therefore, it ensures that the end of the distance sensor always abuts on the wall of the metal tank, so that it is convenient to zero the bendable ruler.

In some embodiments, the measurement unit further comprises a base provided on the chassis, which is slidably connected to the casing; a lower end of the bendable ruler is fixed on the base; the bendable ruler has a scale for measuring a radial deviation of an oil metal tank in the optical-reference-line method. The moving of the bendable ruler has the following meanings: during the process of measurement and calibration, it is often necessary to precisely adjust the position of the bendable ruler. If the position of the bendable ruler is adjusted only by an overall back and forth movement of the wall-climbing robot, a high accuracy cannot be achieved. Therefore, a large-scale movement of the bendable ruler is mainly moved by the wheels of the wall-climbing robot, and a small-scale accurate movement of the bendable ruler is mainly performed by the movement of the bendable ruler of the measuring device. In addition, the base and the chassis are slidably connected by a screw, and the motor drives the screw to rotate so that the base moves forward and backward on the screw. In this way, the position of the bendable ruler can be accurately fine-tuned without operating the wall-climbing robot to drive the wheels, thereby improving an accuracy of the position of the bendable ruler and reducing energy consumption.

In some embodiments, the bendable ruler comprises a mounting part fixed on the base and a movable part connected to the mounting part through a rotation shaft; one side of a top of the mounting part is provided with a rounded corner and the other side is provided with a reset device connected to the movable part; a level control bar is provided above a sliding path of the base to allow the movable part to bend around the rotation shaft. The reset device is a spring or an elastic band, and two ends of the spring or the elastic band are respectively fixed with the movable part and the mounting part by screws. The spring or the elastic band has a certain preload when the movable part is vertical. The mounting part has a rounded side to make the movable part rotatable, and a square side plays a limiting role when the movable part is reset.

In the operation, when the bendable ruler moves to a certain position, the movable part collides with the level control bar; the base continues to drive the mounting part forward, so that the movable part receives resistance and rotates around the rotation shaft, thereby realizing the bending of the bendable ruler. When the base moves in an opposite direction and drive the mounting part to move backward, the movable part no longer collides with the level control bar, so that the movable part is reset due to the spring or the elastic band, and the ruler returns to a vertical state without excessively bending due to the rounded corner. The function of bending and resetting of the bendable ruler allows the wall-climbing robot to pass some places which are lower than the bendable ruler but higher than the casing, and some places with height restrictions. For example, in some typical work scenarios, there are many fire-fighting pipes and reinforced ribs in the oil metal tank. After the wall-climbing robot passes through these places, the bendable ruler returns to the vertical state to perform the measurement.

In some embodiments, the wall-climbing robot further comprises a remote control unit communicated with the control unit. The remote control unit is a separate device with communication functions, or a software installed in a smart phone or other platforms. The remote control unit reads status of the wall-climbing robot, such as the communication mode, the signal intensity, the power supply mode, the remaining power, the attraction value, the attraction mode, etc., and switches the power supply mode, the communication mode and the attraction mode. In addition, the remote control device controls forward, backward, leftward, and rightward movements of the wall-climbing robot; it controls a movement and bending of the bendable ruler; it receives alarm signals in emergency situations, such as insufficient attraction, obstacles ahead; and it starts emergency functions, such as adjusting a position of the permanent magnet attraction unit to the lowest position and automatically returning to a bottom of the oil metal tank under the strong wind.

In some embodiments, a battery compartment which is detachable is provided at the bottom of the chassis, wherein a lower part of the battery compartment is lower than the chassis, so that a center of gravity of the wall-climbing robot is relatively close to the wall surface when it is attracted on the wall surface, thereby improving the attraction performance of the wall-climbing robot. The battery compartment is provided with a slide slot, so that a battery can be quickly mounted and removed by sliding back and forth, thereby facilitating the replacement of the battery. Also, the slide slot limits up and down movement of the battery compartment. Contacts or slots are provided on the front of the battery compartment, so that they are electrically connected to the contacts or slots mounted on the chassis after being installed in place. At the same time, a locking lever is provided at a rear of the chassis, wherein one end of the locking lever is fixed with the chassis through a hinge, and the other end is equipped with a buckle or a slot to be fixed with the chassis. When the locking lever is closed, the locking lever prevents the battery compartment from moving forward and backward; when the locking lever is opened, the battery compartment is able to be removed or inserted.

In some embodiments, the attraction detector comprises a force sensor, which is mounted on the chassis and is electrically connected to the microcontroller, wherein the force sensor is capable of measuring pressures exerted by the magnets on the base to obtain an attraction force between the magnets and the metal wall.

The posture detector comprises a posture sensor, which is mounted on the chassis and electrically connected to the microcontroller, wherein the posture sensor is capable of measuring posture information of the wall-climbing robot.

The distance sensor is a precision distance sensor, wherein the precision distance sensor is mounted near the base of the bendable ruler on the chassis and is electrically connected to the microcontroller; a distance between a base of the precision distance sensor and the base of the bendable ruler is relatively fixed in a vertical direction, so that the precision distance sensor provides an accurate benchmark for the readings of the bendable ruler.

The obstacle detector comprises a non-contact distance sensor, which is installed at the front or rear of the chassis and is electrically connected to the microcontroller, wherein the obstacle detector measures a distance between an obstacle ahead and the wall-climbing robot, and send data to the microcontroller to make the wall-climbing robot avoid the obstacle or stop moving forward; the non-contact distance sensor is an ultrasonic distance sensor or an optical distance sensor.

The communication device comprises a Bluetooth device or a radio communication device, wherein the Bluetooth device or the radio communication device communicates with the remote control device to convey status information and control commands of the wall-climbing robot.

Compared to the prior art, the present invention has following beneficial effects.

The wall-climbing robot for measuring capacity of vertical metal tanks provided in the present invention overcomes the shortcomings of the optical-reference-line method, such as the high labor intensity, high risk and insufficient measurement accuracy. In addition, the wall-climbing robot of the present invention solves the following problems of existing wall-climbing robots: the attraction force cannot be measured and adjusted in real time, resulting in indentations on the wall surface of the metal tank; it is inconvenient to supply power using the cable when the measurement is carried out inside the metal tank; the bendable ruler is too high to pass some fire-fighting pipes; and the wall-climbing robot is affected by the rust formed on the wall of the metal tank.

DETAILED DESCRIPTION OF EMBODIMENTS

Technical solutions in the embodiments of the present invention will be clearly and completely described with reference to the drawings. Obviously, the embodiments are only a part of the embodiments of the present invention. Based on the embodiments of the present invention, all other embodiments obtained by those ordinary skill in the art without creative efforts shall fall within the scope of the invention defined by the appended claims.

Unless otherwise specified, all technical and scientific terminology used herein have the same meaning as commonly understood by those ordinary skill in the art. The terms used herein in the description of the invention is intended to describe the embodiments without limiting. The term "or/and" as used herein indicates one or any combinations of listed elements. Hereinafter, some embodiments of the present invention will be described in detail with reference to the drawings. The following embodiments and the features in the embodiments can be combined with each other as long as they meet the enablement requirement.

Embodiment

Figure 12:
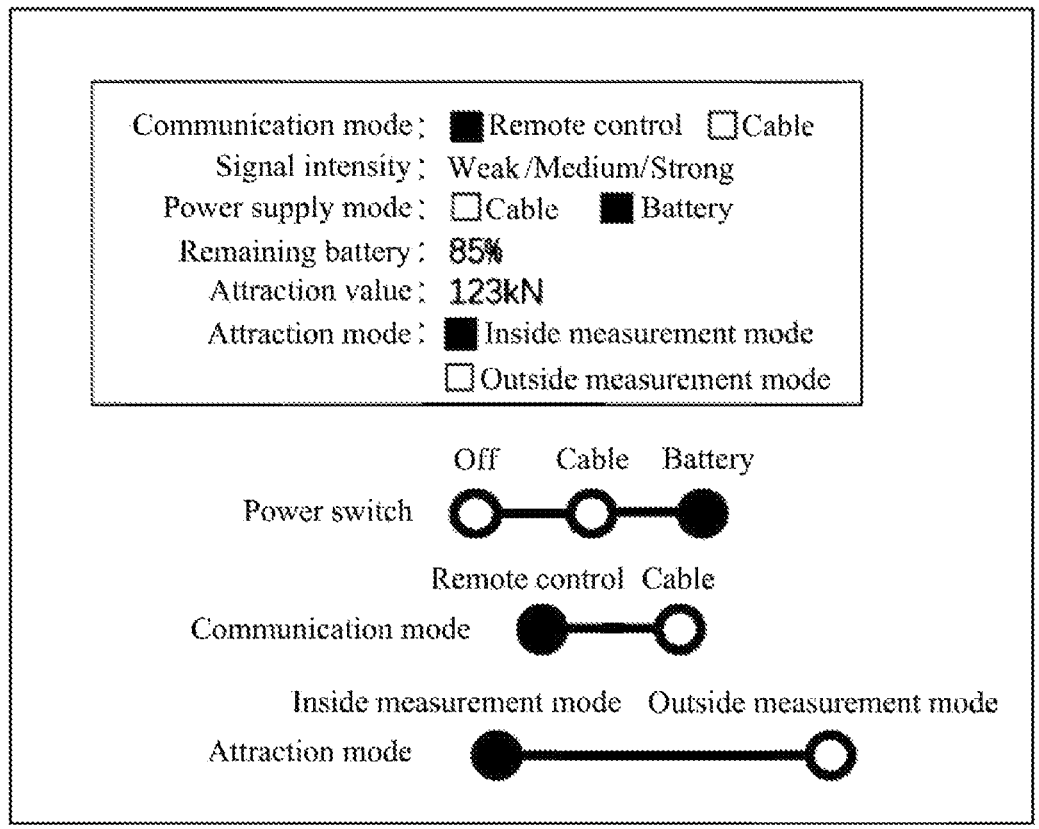
FIG. 12 shows a display panel for a vehicle-mounted display screen and a remote control unit in the embodiment of the present invention.

Referring to FIGS. 1-5, this embodiment provides a wall-climbing robot for measuring capacity of vertical metal tanks, including a robot body, an attraction unit, a rust removal unit, a control unit, a measurement unit, and a remote control unit. The robot body includes a chassis 11, a wheel driving motors 12, a plurality of elastic couplings 17, a casing 13, a battery compartment 14, a locking lever 15, and a plurality of wheels 16. Four groups of the wheel driving motors 12 and the elastic couplings 17 are provided, and are respectively installed at four corners below the chassis 11, where each group is provided with one of the wheels 16. The casing 13 is mounted above the chassis 11 to protect internal components and can be removed when needed. The casing 13 is equipped with a vehicle-mounted display screen 44, which can display status information of the wall-climbing robot, as shown in FIG. 12. The battery compartment 14 is an optional accessory, which can be added to power the wall-climbing robot when working conditions are limited and cable power is not available. The battery compartment 14 is mounted on the chassis 11 through its own slide slot, and can be quickly mounted and removed by sliding back and forth, thereby facilitating the replacement of the battery. Also, the slide slot can prevent the battery compartment 14 from moving up and down. The locking lever 15 is mounted at a rear of the chassis 11; when the locking lever is closed, the locking lever can prevent the battery compartment 14 from moving forward and backward; and when the locking lever is opened, the battery compartment 14 can be removed or inserted.

Figure 3:
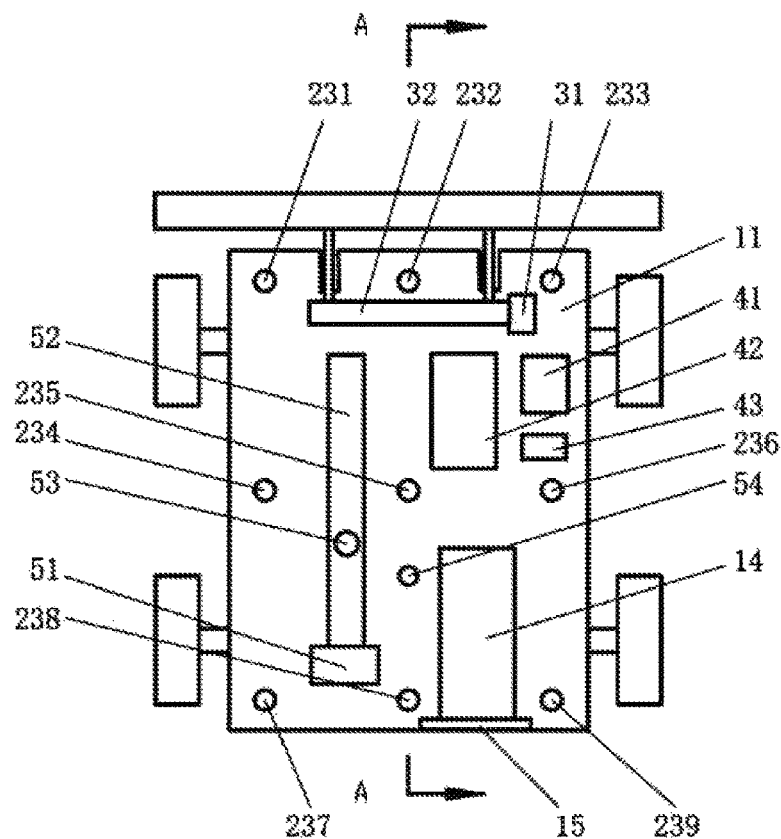
FIG. 3 is a top view of the wall-climbing robot without the casing in the embodiment of the present invention.
Figure 4:
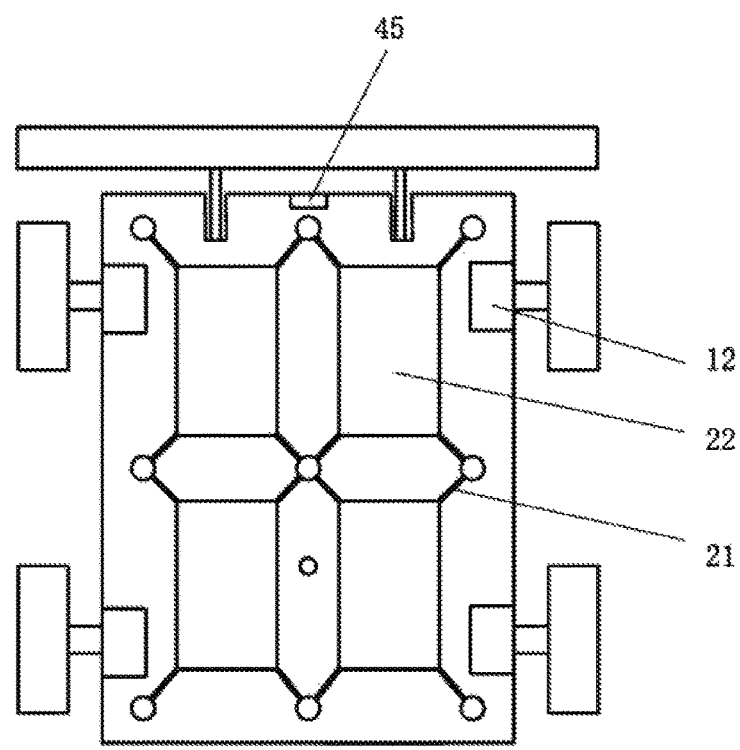
FIG. 4 is a bottom view of the wall-climbing robot in the embodiment of the present invention.

Referring to FIGS. 3-4, a communication device 41, a microcontroller 42 and a posture sensor 43 are provided at a middle of an upper surface of the chassis 11. The chassis 11 is provided with 9 sets of attraction adjustment mechanisms 231-239; an attraction detector 46 is mounted between each of the attraction adjustment mechanisms and the chassis 11; the attraction adjustment mechanisms 231-239 are mounted at an upper side of the chassis 11; each of the attraction adjustment mechanisms connects to a corner of the magnets 22 via a connector 21 by passing through a hole on the chassis 11; four corners of each of the magnets 22 are respectively connected to the attraction detector 46 through a connector 21.

A distance detector 54 is provided at the middle of the upper surface of the chassis 11. Under an action of an internal spring or other principles, a lower end of the distance detector 54 is always in close contact with a wall surface on which the wall-climbing robot travels, thereby obtaining an accurate distance between the chassis and the wall surface.

Referring to FIGS. 1-7, in this embodiment, positions of the magnets 22 are adjusted separately by the attraction adjustment mechanisms 231-239 mounted on the chassis 11 according to different scenarios, such as an inner wall or an outer wall of the oil metal tank, thereby achieving different permanent magnet configuration modes and a better attraction effect.

Figure 6:
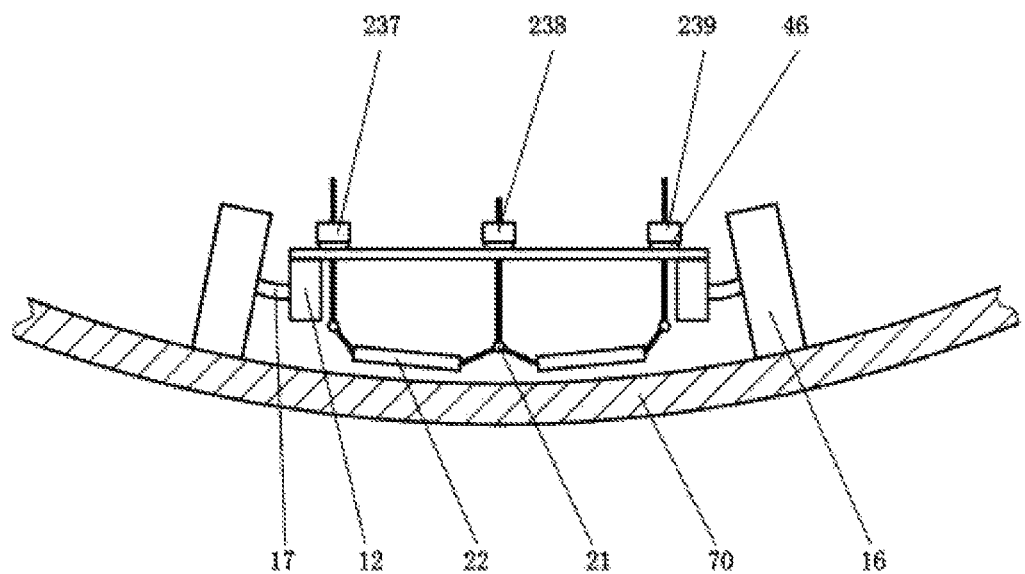
FIG. 6 is a schematic diagram of the wall-climbing robot in the embodiment of the present invention, in which the wall-climbing robot works on an inside of an oil metal tank.

FIG. 6 is a schematic diagram of the wall-climbing robot, in which it works on an inside of the oil metal tank. The connectors 21 on a central axis of the wall-climbing robot are adjusted to a lower position by three sets of the attraction adjustment mechanisms 232, 235, and 238 on the central axis of the wall-climbing robot; the connectors 21 on both sides are adjusted to a higher position by the attraction adjustment mechanisms 231, 233, 234, 236, 237, 239 which are located on both sides of the wall-climbing robot, so that the magnets 22 connected to the connectors 21 has a posture of being low at the center axis and high at both sides. Therefore, it can better fit with the inside of the wall surface 70, and there is a relative small gap between the four magnets 22 and the wall surface, resulting in a relative large attraction force, thereby achieving a relatively stable attraction effect. At the same time, since the elastic couplings 17 have a certain bending ability, the elastic couplings can be slightly bent while maintaining a high efficiency of transmitting the torque of the drive motor 12 to the wheel 16, to allow the wheels to slightly tilt to fit an arc of the inner wall of the oil metal tank, thereby improving a grip of the wheels 16 when the wall-climbing robot works inside the tank.

Figure 7:
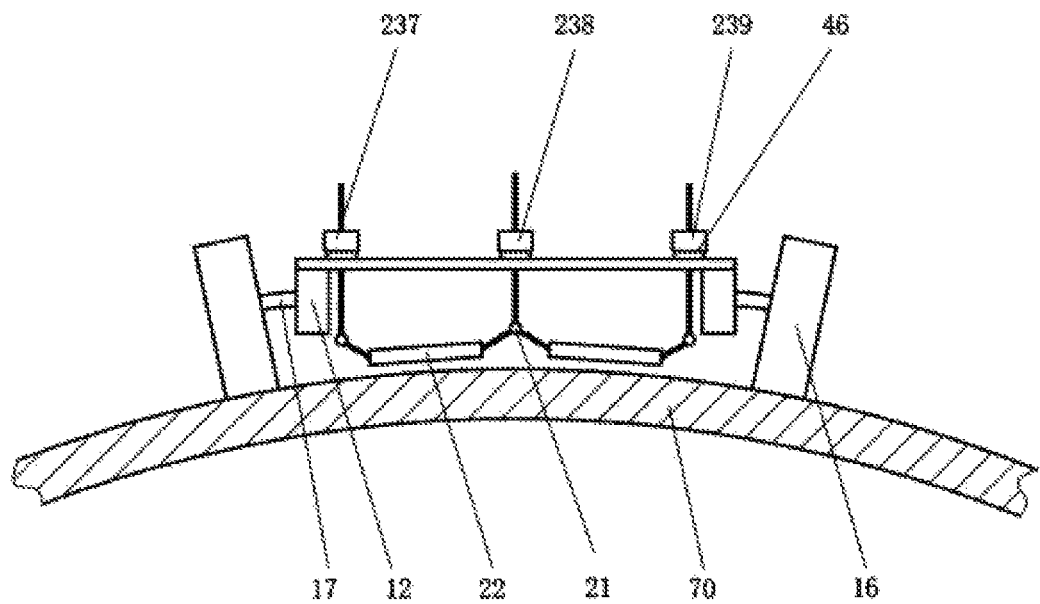
FIG. 7 is a schematic diagram of the wall-climbing robot in the embodiment of the present invention, in which the wall-climbing robot works on an outside of the oil metal tank.

FIG. 7 is a schematic diagram of the wall-climbing robot, in which it works on an outside of the oil metal tank. The connectors 21 on the central axis of the wall-climbing robot are adjusted to a higher position by three sets of attraction adjustment mechanisms 232, 235, and 238 on the central axis of the wall-climbing robot; the connectors 21 on both sides are adjusted to a lower position by the attraction adjustment mechanisms 231, 233, 234, 236, 237, 239 which are located on both sides of the wall-climbing robot, so that the magnets 22 connected to the connectors 21 has a posture of being high at the center axis and low at both sides. Therefore, it can better fit with the outside of the wall surface, and there is a relatively small gap between the four magnets 22 and the outside of the wall surface, resulting in a relatively large attraction force, thereby achieving a relatively stable attraction effect. At the same time, since the elastic couplings 17 have a certain bending ability, the elastic couplings can be slightly bent while maintaining a high efficiency of transmitting the torque of the drive motor 12 to the wheel 16, to allow the wheels to slightly tilt to fit an arc of the outer wall of the oil metal tank, thereby improving a grip of the wheels 16 when the wall-climbing robot works outside the tank.

In this embodiment, each of the connectors 21 includes a vertical connecting rod connected to the chassis and a pull rod or rope for connecting the magnets 22, and the pull rod is rotatable around a bottom end of the vertical connecting rod. The chassis is provided with a through hole for transmitting the vertical connecting rod. Each of the attraction adjustment mechanisms 231-239 includes an adjustment block provided on the through hole and configured to adjust the vertical connecting rod to slide up and down along the through hole. The attraction detector 46 between the adjustment block and the chassis can measure the attraction of the adjustment block. Therefore, when the wall-climbing robot travels on an irregular curved surface, positions of the attraction adjustment mechanisms 231-239 can be adjusted in real time by detecting the attraction result, thereby achieving a relatively good attraction effect.

In dangerous situations, for example, when the wind in a workplace of the wall-climbing robot suddenly increases, and exceeds maximum wind power limit, the remote control is operated by an operator to lower the magnets 22 to the lowest position via the attraction adjustment mechanisms 231-239, or even to a position which directly contacts with the wall of the metal tank to achieve a maximum attraction.

In this embodiment, a bendable ruler 53 of the wall-climbing robot is a part of the measurement unit, and is bendable and capable of moving forward and backward. Referring to FIGS. 1, 3, and 8-11, a first drive motor 51, a first drive shaft 52, and the bendable ruler 53 are mounted on the chassis 11; a level control bar 55 is mounted on the casing 13. A ball screw transmission pair is provided between the first drive shaft 52 and a base 535. The first drive motor 51 drives the first drive shaft 52 to rotate, so that the bendable ruler and other parts move forward and backward with the base 535 along the drive shaft 52. This configuration is mainly intended to precisely adjust the position of the bendable ruler in the processes of measurement and calibration the bendable ruler. If the position of the bendable ruler 53 is adjusted only by an overall back and forth movement of the wall-climbing robot, high accuracy cannot be achieved. Therefore, a large-scale movement of the bendable ruler 53 is mainly achieved by the wheels of the wall-climbing robot, and a small-scale accurate movement of the bendable ruler 53 is mainly performed by the movement of the bendable ruler of the measuring device.

Figure 8:
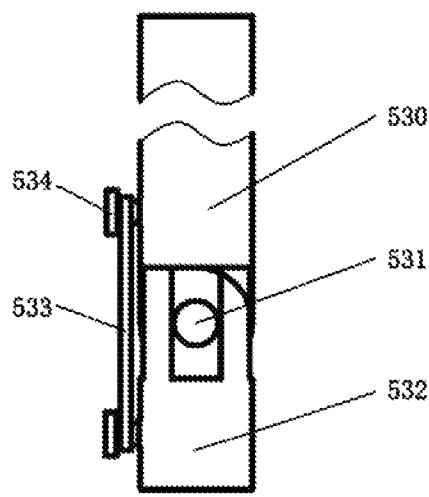
FIG. 8 is a schematic diagram of a ruler according to the embodiment of the present invention, in which the bendable ruler is in a vertical state.
Figure 9:
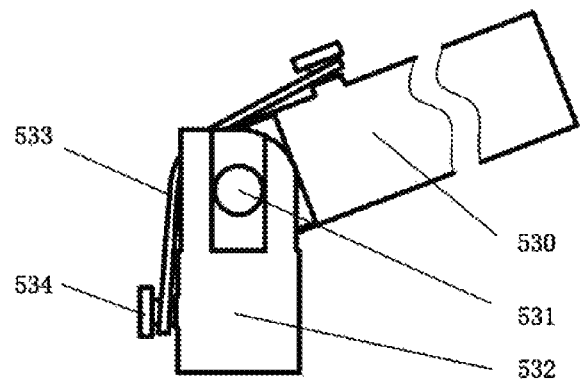
FIG. 9 is a schematic diagram of the bendable ruler in the embodiment of the present invention, in which the bendable ruler is bent.

In addition, the bendable ruler 53 is bendable. FIG. 8 is a schematic diagram of the bendable ruler, in which the bendable ruler is in a vertical state, and FIG. 9 is a schematic diagram of the bendable ruler, in which the bendable ruler is bent. The bendable ruler 53 includes a movable part 530, a rotation shaft 531, a mounting part 532, an elastic band 533, and a plurality of screws 534. The movable part 530 and the mounting part 531 are hinged through the rotation shaft 531, and the mounting part 532 is mounted on the base 535. A screw 534 is respectively provided on a side of the movable part 530 and a side of the mounting part 532; the elastic band 533 is provided between the two screws 534. The mounting part 532 has a rounded corner on one side and a square corner on the other side, so that an upper part of the bendable ruler can only be bent in one direction; under an action of the elastic band 533, the bendable ruler 53 keeps vertical without being subjected to external side forces.

Figure 10:
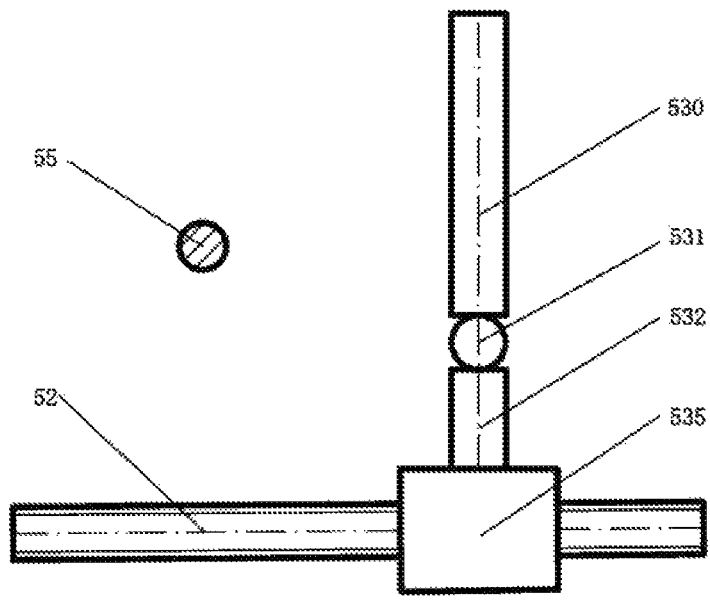
FIG. 10 is a schematic diagram of the bendable ruler in movement in the embodiment of the present invention.
Figure 11:
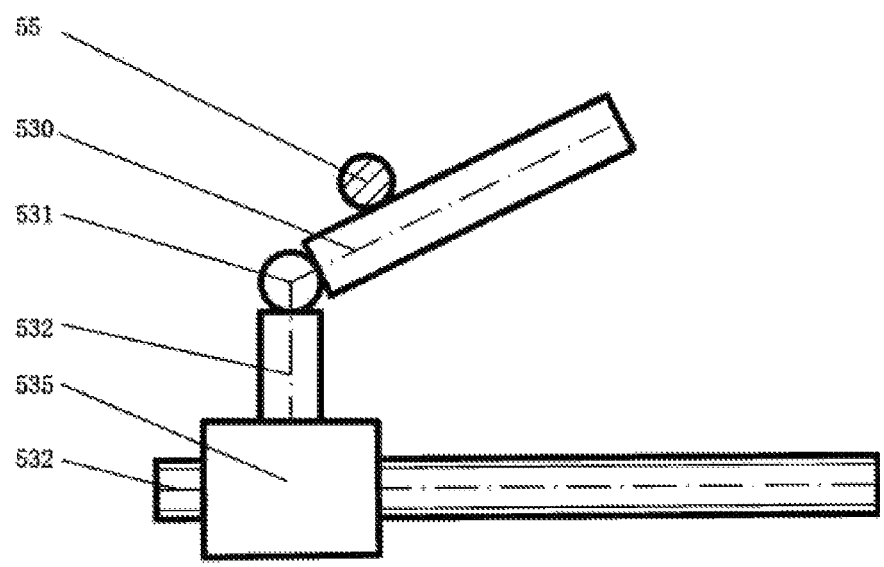
FIG. 11 is a schematic diagram of the moving bendable ruler in a bent state in the embodiment of the present invention.

FIGS. 9-10 show a principle of bending and restoring of the bendable ruler. The bendable ruler moves within a certain range, and the bendable ruler will not be bent unless the bendable ruler collides with the level control bar 55. When the bendable ruler moves to the left to a certain position, the movable part 530 collides with the scale level control bar 55 installed on the casing 13 and suffers resistance. As the bendable ruler continues to move to the left, the angle between the movable part 530 and the mounting part 532 is getting larger and larger, so that maximum height of the ruler 53 is reduced. On the other hand, when the bendable ruler moves to the right, the resistance from the level control bar 55 gradually decreases, and the angle between the movable part 530 and the mounting part 532 becomes smaller and smaller, and finally the bendable ruler 53 returns to a vertical state.

Therefore, since the bendable ruler is bendable, the wall-climbing robot can smoothly pass some places with height restrictions. For example, in a typical working scene, there are many fire-fighting pipes and reinforced ribs in the oil metal tank, this function allows the wall-climbing robot to pass these places with height restrictions. Further, the bending of the bendable ruler is realized by the moving thereof, and a new drive unit is eliminated, which is of great significance for simplifying structures and reducing weight.

Figure 1:
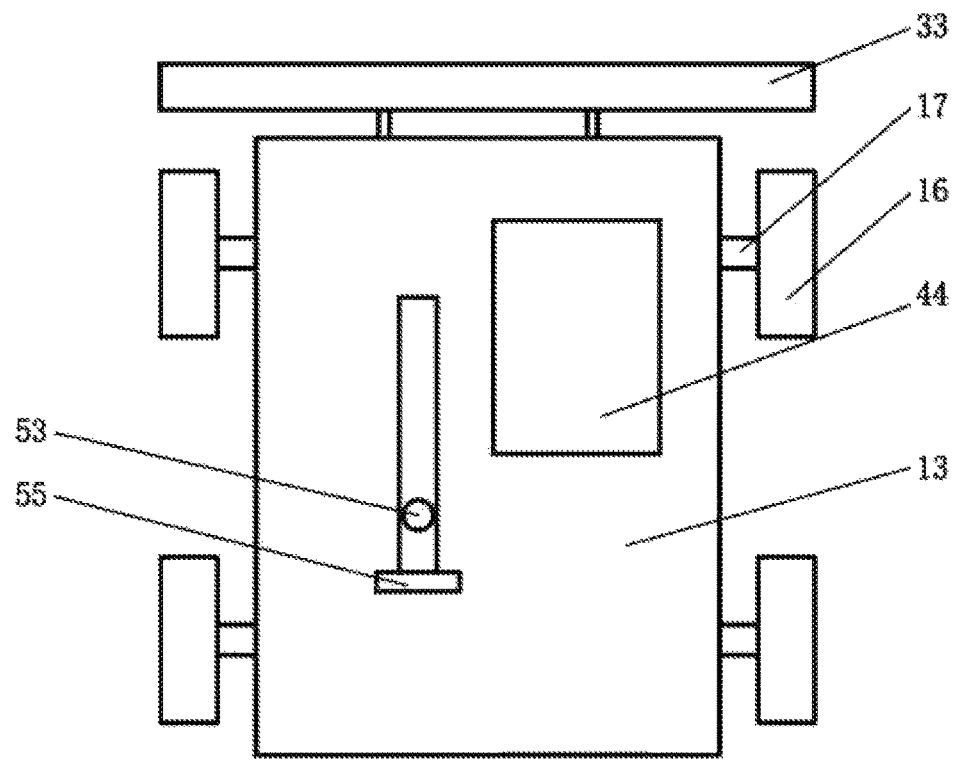
FIG. 1 is a top view of a wall-climbing robot with a casing in an embodiment of the present invention.
Figure 2:
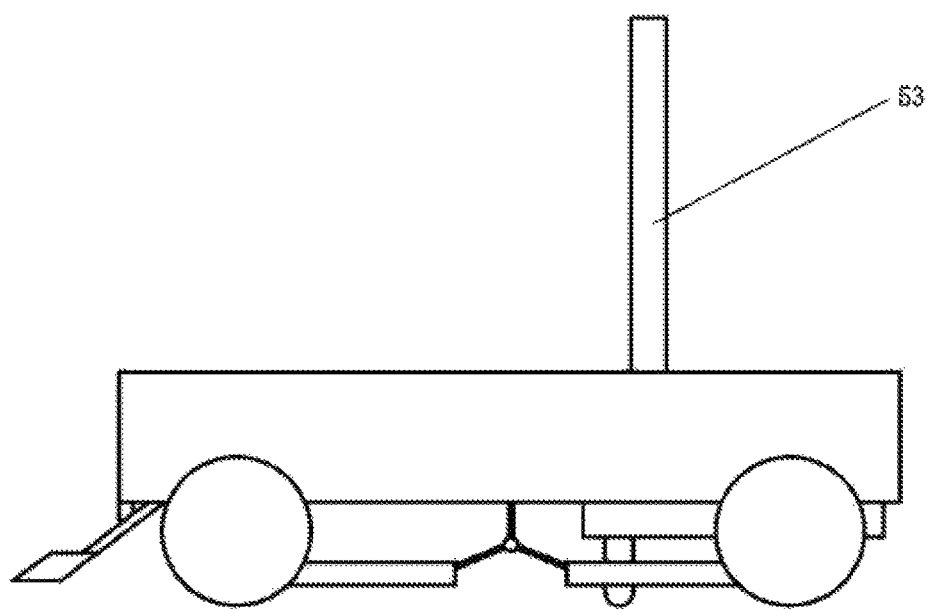
FIG. 2 is a side view of the wall-climbing robot with the casing in the embodiment of the present invention.
Figure 5:
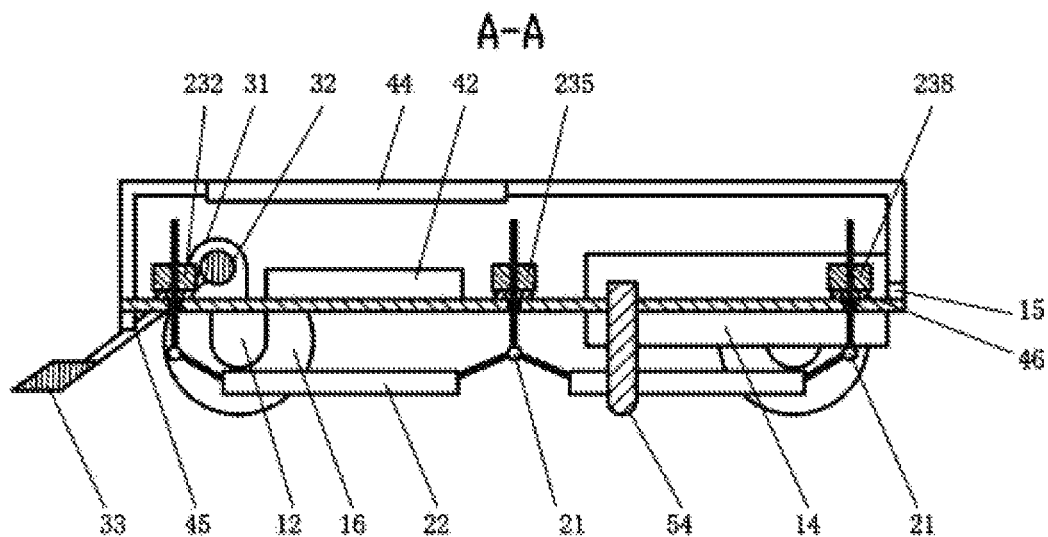
FIG. 5 is a cross-sectional view taken along A-A in FIG. 3.

In this embodiment, the wall-climbing robot has a certain rust removing function. Referring to FIGS. 1, 3 and 5, the rust removal unit includes a second drive motor 31, a second drive shaft 32, and a rust removal bucket 33. The second drive motor 31 and the second drive shaft 32 are provided at a front of the chassis 11; the second drive motor 31 drives the second drive shaft 32 to rotate, and finally control lifting and lowering movement of the rust removal bucket 33. After long-term operation of the vertical metal tanks, there are many problems, for example, coatings on the wall surface of some ring plates of the vertical metal tanks are corroded or even peeled, and exposed steel plates are rusted, which will adversely affect the accuracy and efficiency of measurement. The rust removal bucket 33 is provided at a front side of the wall-climbing robot to remove the rust. When the rust removal bucket is lifted, it can eliminate a friction between the rust removal bucket and the wall, thereby reducing a running resistance under normal circumstances and reducing power consumption.

In this embodiment, the wall-climbing robot can avoid abnormal conditions to some extent. The abnormal conditions mainly refer to a deviation of a moving direction from a predetermined direction, an obstacle ahead, and a sudden lack of attraction. During the traveling process, due to various existing abnormal situations, such as inconsistent speeds of the two motors, collision of tires with obstacles, bending of the wall of the metal tank, etc., the wall-climbing robot may have a tendency to deviate from a predetermined direction. The posture sensor 43 detects postures of the wall-climbing robot in real time and transmit posture data thereof to the microcontroller 42. The microcontroller 42 compares a preset direction with the real-time posture data, and adjusts the speed difference of the drive motors 12 of the wheels on both sides of the wall-climbing robot until a correct direction is restored. During the travelling, when an obstacle that the operator cannot visually see in the oil metal tank appears in front of the wall-climbing robot, the obstacle detector 45 detects a distance from the obstacle to the wall-climbing robot, and transmits the information to the microcontroller 42. The microcontroller 42 sends a signal to the remote control unit through the communication device 41 to remind the operator and automatically stops the wall-climbing robot from travelling.

What is claimed is:

1. A wall-climbing robot for measuring a capacity of a vertical metal tank, comprising: a robot body comprising a chassis and a casing, wherein a plurality of wheels are provided on both sides of the chassis, respectively; the robot body further comprises:
   an attraction unit, comprising a plurality of magnets for attracting a wall of the metal tank, wherein the magnets are connected to form a mesh structure through a plurality of connectors and move under the chassis;
   a measurement unit, comprising a bendable ruler provided on the chassis and protruding from a top of the casing;
   a rust removal unit, comprising a rust removal bucket provided at a front side of the robot body and a driver for the lifting and lowering of the rust removal bucket; and
   a control unit, comprising a microcontroller, a posture detector, an obstacle detector, an attraction detector for detecting an attraction force of the magnets, a distance sensor for measuring a distance from the chassis to the wall of the metal tank, and a communication device.

2. The wall-climbing robot of claim 1, wherein each of the connectors comprises a vertical connecting rod connected to the chassis and a pull rod or rope for connecting the magnets, wherein the pull rod is rotatable around a bottom end of the vertical connecting rod.

3. The wall-climbing robot of claim 2, wherein the chassis is provided with a through hole for transmission of the vertical connecting rod; an adjustment block for adjusting the vertical connecting rod to slide up and down along the through hole is provided on the through hole; and the attraction detector is provided between the adjustment block and the chassis.

4. The wall-climbing robot of claim 3, wherein the adjustment block is in threaded connection with the vertical connecting rod.

5. The wall-climbing robot of claim 1, wherein the chassis is provided with a motor for driving the wheels, and each of the wheels is connected to an output end of the motor via an elastic coupling.

6. The wall-climbing robot of claim 1, wherein an end of the distance sensor is provided with a spring to allow the other end of the distance sensor to abut on the wall of the metal tank.

7. The wall-climbing robot of claim 1, wherein the measurement unit further comprises a base provided on the chassis, which is slidably connected to the chassis, and a lower end of the bendable ruler is fixed on the base.

8. The wall-climbing robot of claim 7, wherein the bendable ruler comprises a mounting part fixed on the base and a movable part connected to the mounting part through a rotation shaft; one side of a top of the mounting part is provided with a rounded corner and the other side is provided with a reset device connected to the movable part; and a level control bar is provided above a sliding path of the base to allow the movable part to bend around the rotation shaft.

9. The wall-climbing robot of claim 1, further comprising a remote control unit communicated with the control unit.

10. The wall-climbing robot of claim 1, wherein a battery compartment that is detachable is provided at the bottom of the chassis.

\* \* \* \* \*